US005734676A

United States Patent [19]
Dingsor

[11] Patent Number: 5,734,676
[45] Date of Patent: Mar. 31, 1998

[54] APPARATUS, METHOD AND ARTICLE OF MANUFACTURE FOR CARRIER FREQUENCY COMPENSATION IN A FM RADIO RECEIVER

[75] Inventor: Andrew Dwight Dingsor, Durham, N.C.

[73] Assignee: International Business Machines Corporation, Armonk, N.Y.

[21] Appl. No.: 653,571

[22] Filed: May 24, 1996

[51] Int. Cl.[6] .................................. H04L 5/16; H04B 1/38
[52] U.S. Cl. ........................... 375/222; 375/271; 455/73
[58] Field of Search ............................. 375/219, 222, 375/295, 316, 326, 344, 271, 302, 322, 285, 346; 329/319; 332/123, 117; 455/89, 73, 119, 91; 371/30

[56] References Cited

U.S. PATENT DOCUMENTS

| | | | |
|---|---|---|---|
| 4,079,320 | 3/1978 | Mogi | 325/420 |
| 4,127,818 | 11/1978 | Mogi | 325/418 |
| 4,870,699 | 9/1989 | Garner et al. | 455/76 |
| 4,893,317 | 1/1990 | Critchlow et al. | 375/97 |
| 4,905,305 | 2/1990 | Garner et al. | 455/183 |
| 5,201,063 | 4/1993 | Tam et al. | 455/67.4 |
| 5,313,656 | 5/1994 | Vaisanen et al. | 455/67.1 |
| 5,335,362 | 8/1994 | Vaisanen et al. | 455/67.1 |
| 5,396,251 | 3/1995 | Schnermann | 342/51 |
| 5,423,070 | 6/1995 | Vaisanen et al. | 455/67.1 |
| 5,453,748 | 9/1995 | Lindell | 342/51 |
| 5,493,583 | 2/1996 | Cripps | 375/219 |
| 5,584,062 | 12/1996 | Meador et al. | 455/260 |

OTHER PUBLICATIONS

The Versatility of Digital Signal Processing Chips, IEEE Spectrum Jul. 1987, pp. 40–45.
Coded Modulations for Fading Channels: An Overview; Sundberg, et al, pp. 309–321.

*Primary Examiner*—Tesfaldet Bocure
*Attorney, Agent, or Firm*—John D. Flynn

[57] ABSTRACT

A method, apparatus and article of manufacture for compensating for carrier frequency error is disclosed. An FM signal is received from an antenna and the received FM signal is provided to receiver. The receiver takes the FM signal at the carrier frequency and outputs a baseband signal. This baseband signal is then processed by a DSP which provides carrier frequency compensation and decoding to produce a data stream that a microprocessor provides to a host device. Frequency differences between the FM carrier frequency and the frequency used to demodulate the FM signal can shift the DC bias level of the baseband signal. The DSP compensates for such frequency difference by using a receive compensation value and applying it to each received signal sample. When transmitting, data to be transmitted is provided from the host device to the DSP via a microprocessor. The DSP provides encoding and carrier frequency compensation of the data to provide an baseband signal to a transmitter that modulates the baseband signal to produce a FM signal at a desired carrier frequency. Frequency differences between the desired FM carrier frequency and the frequency used to modulate the baseband signal can produce errors in receiver systems. The DSP compensates for such a frequency difference by using a transmit compensation value and applying it to each encoded signal sample.

16 Claims, 10 Drawing Sheets

601

Demodulating an FM Signal using a
Local Oscillator Signal to Produce a Baseband Signal.

603

Converting the Baseband Signal into Digital Samples.

605

Compensating each Sample with a Compensate Value.

607

Decoding the Compensated Digital Samples

609

Outputting the Digital Data

APPARATUS, METHOD AND ARTICLE OF MANUFACTURE FOR CARRIER FREQUENCY COMPENSATION IN A FM RADIO RECEIVER

BACKGROUND OF THE INVENTION

1. Related Applications

The present invention relates to "An Apparatus, Method and Article of Manufacture for Carrier Frequency Compensation in a FM Radio Transmitter" Ser. No. 08/653,307 IBM docket no.: RA9-95-078 filed 24 May 1996 assigned to the same assignee as the present invention, herein incorporated by reference. The present invention relates to "An Apparatus, Method and Article of Manufacture for Carrier Frequency Compensation in a FM Radio" Ser. No.: 08/655,331 IBM docket no.: RA9-96-038 filed 24 May 1996 assigned to the same assignee as the present invention, herein incorporated by reference.

2. Field of the Invention

The present invention is related to digitally controlled radio communications devices and more particularly, to error compensation in the carrier frequency of an FM radio.

3. Description of the Prior Art

Most wireless modems make use of crystal controlled oscillator to generate a local oscillator frequency used to transmit and receive data signals to an from the air interface via an antenna. Crystal controlled oscillators are used where required by law (e.g., broadcast and citizens band transmitters), where operations on only a few frequencies are anticipated and where space is a problem (i.e., where a bulky tuned circuit cannot conveniently be used and can be replaced by a more compact crystal). Due to variations in the crystal components there is usually frequency deviation associated with particular crystal oscillator components.

When FM radio transmitters and/or receivers are manufactured in large quantities, the carrier frequency of each unit will vary due to intrinsic differences in the crystal because of variations in crystal oscillator parts. In the transmitter this causes the transmitted signal to be off-frequency. In a radio-data modem using an FM radio transmitter, the carrier frequency error causes loss of data error margin, higher bit error rates, which result in more data frames being transmitted in error, more re-tries, and slower perceived throughput for the user of the radio-data modem. This loss of error margin is particularly significant in 4-level data encoding systems like RD-LAP.

In the receiver, the mismatch between the receiver's frequency and that of a transmitting base station causes the received demodulated signal to have a dc bias offset. The mismatch in frequencies may be caused by variations in the crystal oscillator components of the transmitter, the receiver or a combination of both. In a radio-data modem using a FM radio receiver, the mismatch between the carrier frequency and the receiver's local oscillator frequency causes loss of data error margin, higher bit error rates which results in more data frames being transmitted in error, more re-tries, and slower perceived throughput for the user of the radio-data modem. This loss of error margin is particularly significant in 4-level data encoding systems like RD-LAP.

This problem has traditionally been reduced at the transmitter by stabilizing and tweaking the crystal oscillator using hardware techniques, and/or by specifying more accurate and more expensive oscillator parts that provide a smaller frequency deviation. Similarly, this problem has traditionally been reduced at the receiver by stabilizing and tweaking the crystal oscillator using hardware techniques, and/or by specifying more accurate and more expensive oscillator parts that provide a smaller frequency deviation. Tweaking is usually performed manually and thus is expensive, time consuming and error prone process. Also, the use of crystal oscillator components with smaller frequency deviations increases the cost of the crystal oscillator components thus, increasing the cost of the radio data modem.

The carrier frequency error problem has also been reduced at the receiver by implementing automatic frequency tracking capabilities. These techniques analyze the content of a received signal over time, and adjust the receiver to compensate. However, these techniques do not eliminate the problem completely because data at the beginning of a frame can be received in error or not at all, while the tracker is attempting to lock or settle onto the received carrier frequency signal. Thus, initial data frames are lost resulting in less data throughput.

These unresolved problems and deficiencies are clearly felt in the art and are solved by the invention in the manner described below.

SUMMARY OF THE INVENTION

The above-mentioned needs have been met in accordance with the present invention by providing for a method, apparatus and article of manufacture for compensating for carrier frequency error. An FM signal is received from an antenna and the received FM signal is provided to a receiver. The receiver takes the FM signal at the carrier frequency and outputs a baseband signal. This baseband signal is then processed by a DSP which provides carrier frequency compensation and decoding to produce a data stream that a microprocessor provides to a host device. Frequency differences between the FM carrier frequency and the frequency used to demodulate the FM signal can produce a shift in the baseband signal produced. The DSP compensates for such frequency difference by using a receive compensation value and applying it to each received signal sample. When transmitting, data to be transmitted is provided from the host device to the DSP via a microprocessor. The DSP provides encoding and carrier frequency compensation of the data to provide a baseband signal to a transmitter that modulates the baseband signal to produce a FM signal at a desired carrier frequency. Frequency differences between the desired FM carrier frequency and the frequency used to modulate the baseband signal can produce errors in receiver systems. The DSP compensates for such a frequency difference by using a transmit compensation value and applying it to each encoded signal sample.

It is an object of the present invention to provide FM communications that are less error prone.

It is a further object of the present invention to provide FM communications that reduce the number of transmission retries.

It is an object of the present invention to provide FM communications with higher throughput.

It is another object of the present invention to provide carrier frequency error compensation that permits radio system to be built at lower cost.

It is a further object of the present invention to provide FM communications with a minimum impact on the communications time line.

It is yet another object of the present invention to provide carrier frequency error compensation with less dependency on automatic frequency correction mechanism.

It is yet another object of the present invention to provide carrier frequency error compensation with less dependency on an automatic frequency correction mechanism such that data at the beginning of a frame is received with fewer errors.

It is still another object of the present invention to provide carrier frequency error compensation which permits FM radio data modems to be manufactured in large quantities with low cost parts having larger tolerances.

BRIEF DESCRIPTION OF THE DRAWINGS

The foregoing and other objects, aspects and advantages of the invention will be better understood from the following detailed description with reference to the drawings, in which:

FIG. 6 depicts a method of receiving FM signals in accordance with the present invention.

DETAILED DESCRIPTION

Figure 1:
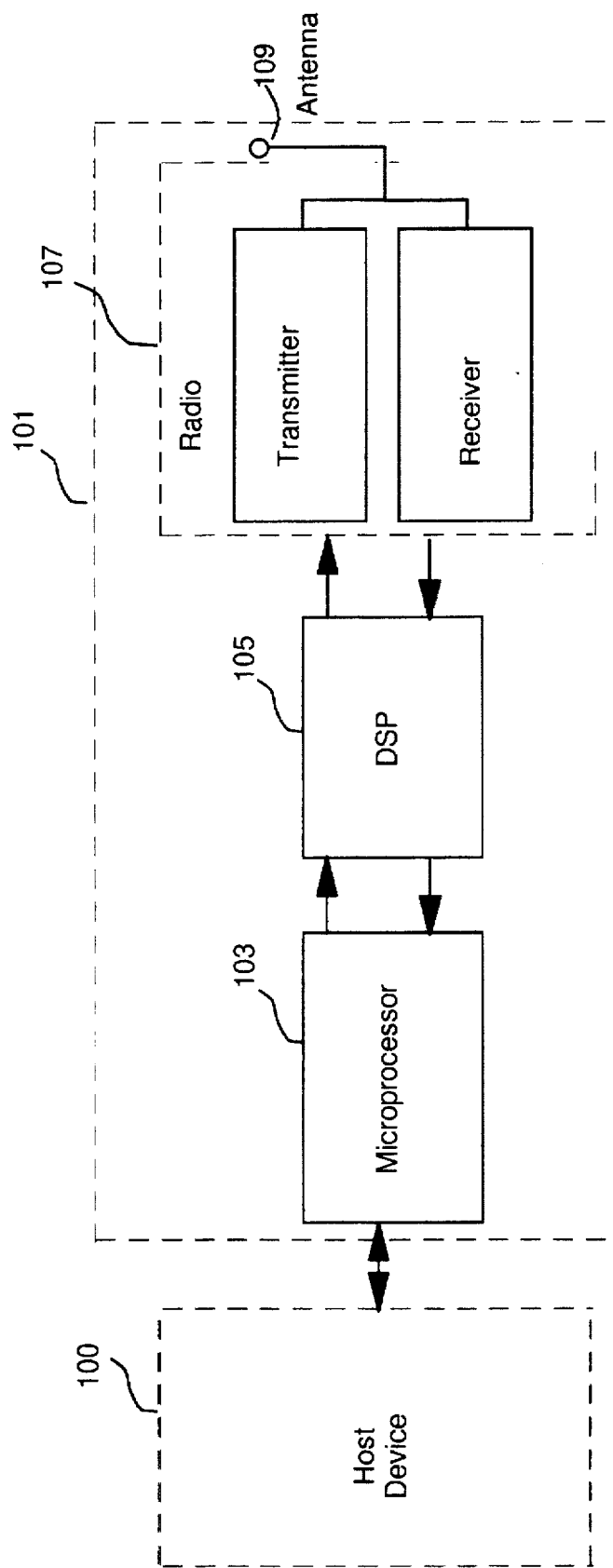
FIG. 1 depicts a computer system with a radio data modem providing transmit and receive carrier frequency compensation.

An overview of a host device 100 and wireless modem 101 system is shown in FIG. 1. A wireless modem 101 is similar to a wired modem in that it permits a computer or other device to send and receive data from external sources. The host device 100 can be a computer such as a laptop, palm top, personal digital assistant (PDA), PC, mainframe, base station, switch or other processing device. The wireless modem 101 may be installed as an adapter card or slot such as a PCMCIA slot or may be packaged in a standalone housing. The present invention provides frequency compensation to a carrier frequency used in wireless communication. The frequency compensation may be applied when the radio modem is transmitting and/or receiving signals. The present invention may be used with any FM radio system including but not limited too the following: Cellular Digital Packet Data (CDPD), AMPS data, cellular data, Radio Data Link Access Protocol (RDLAP) and Motorola Data Communication (MDC).

In the preferred embodiment, the radio modem consists of three major components: a microprocessor 103, a digital signal processor (DSP) 105 and radio 107 including an antenna. The microprocessor 103 including memory (i.e., in the preferred embodiment static random access memory RAM (SRAM) and/or flash memory and/or DRAM) and associated circuity is responsible for interfacing with the host computer 100 or other device wishing to send and receive data. It may provide other functions such as buffering; modem management functions; DSP configuration and booting or startup; and radio configuration configuration and booting or start up; and messaging and protocol management. The microprocessor may also control channel and frequency assignment and control of the frequency synthesizer or frequency generator that makes use of the crystal to provide signals at frequencies necessary for modulation and demodulation of RF signals. The microprocessor may also provide additional layers of protocol stack, such as the CDPD MAC (media access control) layer, and the RD-LAP Service Sublayer. The microprocessor interface permits the modem to receive data and commands from the host device and provide data and status information to the host device.

The DSP 105 provides transmit functions including encoding and carrier frequency compensation to signals that are transmitted. The DSP 105 provides receive functions including decoding and carrier frequency compensation to signals that are received. In the preferred embodiment the DSP 105 provides processing that provides for carrier frequency compensation for transmitted signals and received signals. DSP functions are one or more instructions carried out by the DSP on the data or data streams in the DSP pipeline. These instructions may be obtained from memory associated with the DSP or memory associated with the radio modem. The microprocessor may assist in loading the DSP instructions from non-volatile memory to volatile memory or DSP memory, and may even load instructions from a host device. The DSP instructions can thus be distributed on any medium for carrying software instructions. DSP instructions may be stored in non-volatile memory on board the radio modem, within the DSP and/or in memory devices such as ROM, EEPROM, Flash memory or any other memory device accessible by the DSP. The DSP 105 functions are discussed in detail below.

In the preferred embodiment the radio 107 consists of a transmitter for modulating signals and a receiver for demodulating signals. The transmitter and receiver may share a common antenna 109 via a duplexer. The transmitter is responsible for generating an FM signal at a carrier frequency using a baseband signal and a local oscillator signal (i.e., modulating the carrier frequency in accordance with the baseband signal). The receiver is responsible for producing a baseband signal from an FM signal using a local oscillator signal (i.e., demodulating the FM signal using the changing carrier frequency to provide the baseband signal). The radio 107 or communications circuitry provides physical access to a network or connection (i.e., the wireless or cellular network of the preferred embodiment). The radio 107, as is common among cellular modems, may have its own battery. An antenna is used for transmitting and receiving the electromagnetic communications signals from the air interface. The transmitter and receiver are discussed in detail below.

Figure 2:
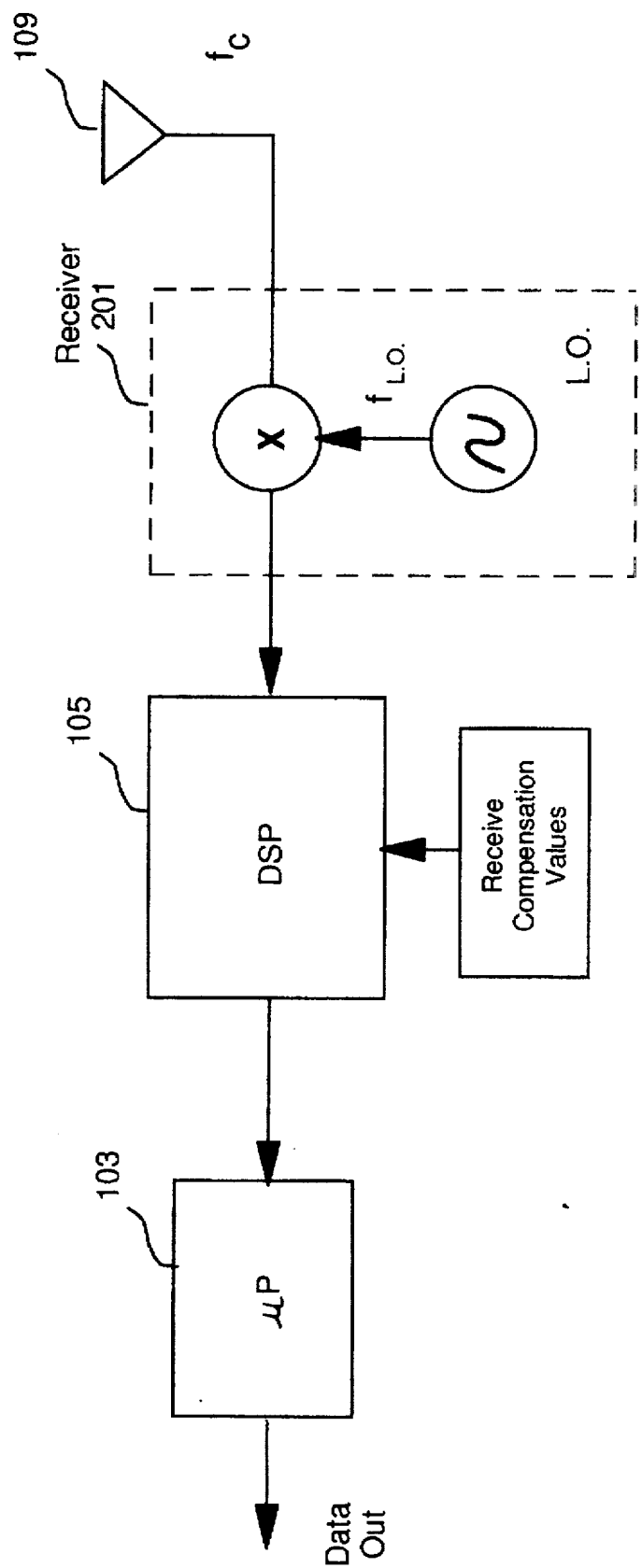
FIG. 2 depicts compensation for the carrier frequency error when receiving a FM radio signal.
Figure 3:
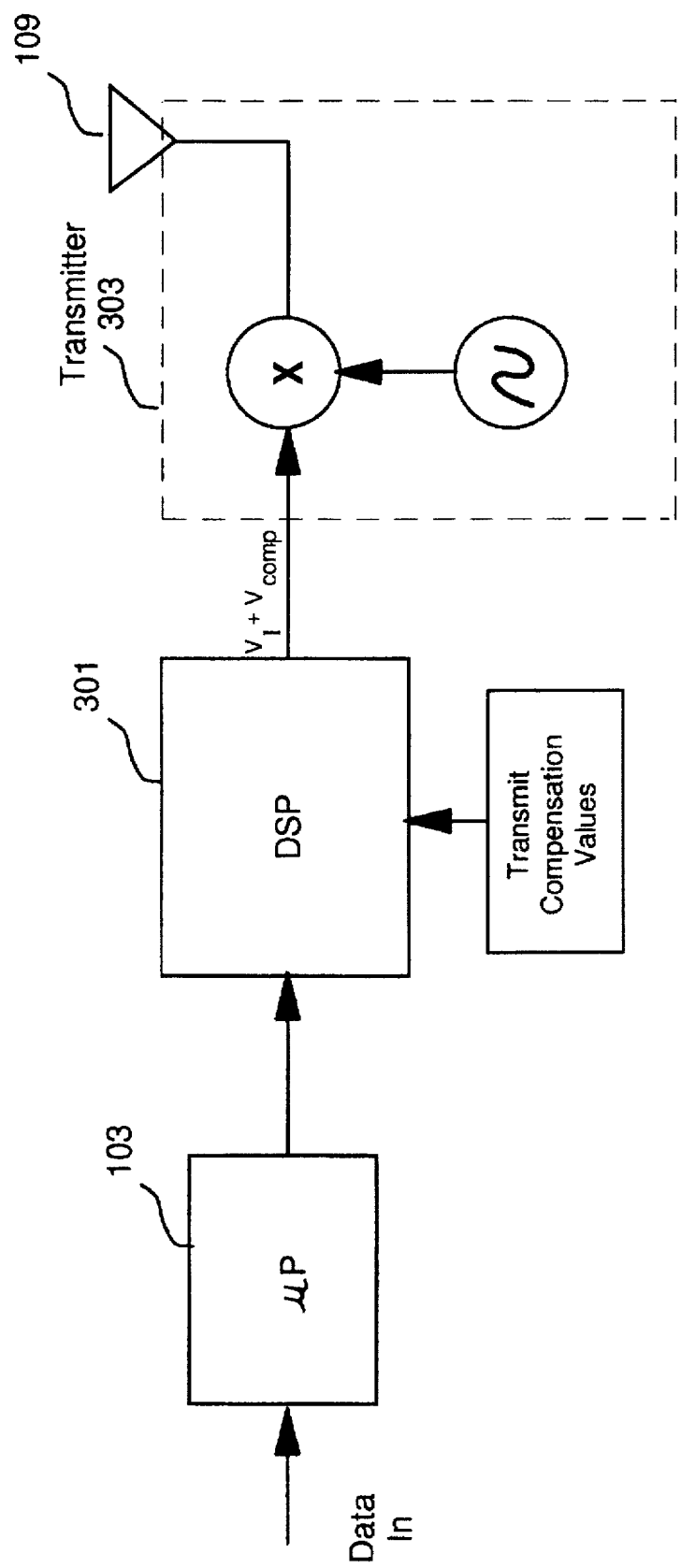
FIG. 3 depicts compensation for the carrier frequency error when transmitting an FM radio signal.
Figure 5:
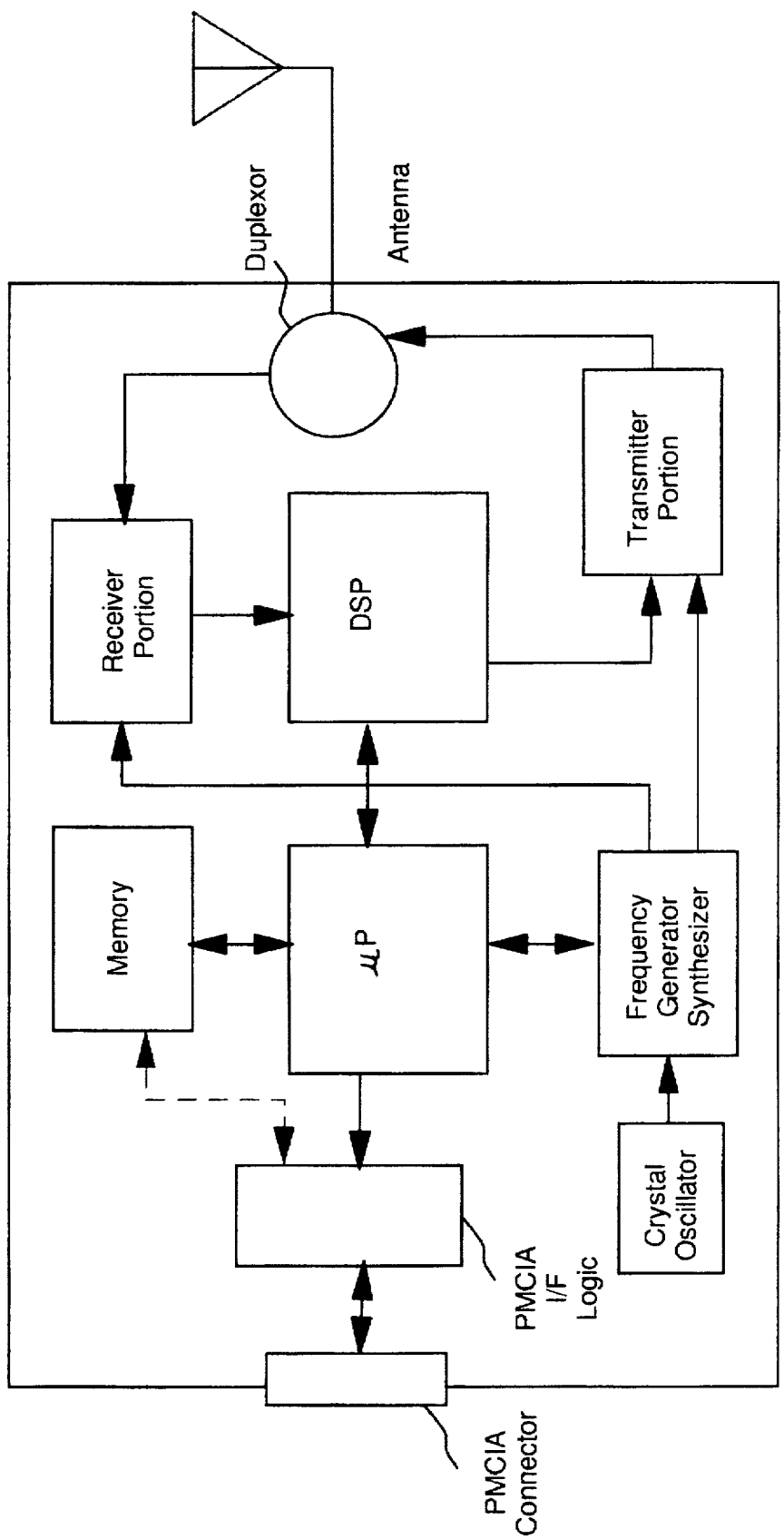
FIG. 5 depicts an FM radio data modem that provides carrier frequency error compensation when receiving and transmitting FM radio signals.

In the preferred embodiment the radio modem fits into a PCMCIA slot of a host device. FIG. 5 depicts a wireless modem with a PCMCIA connector and PCMCIA interface logic for providing the modem with an external interface. Note that various components of the modem may be located externally from the PCMCIA card (i.e., the battery, antenna, radio). Note that in both the Receiver and Transmitter a local oscillator signal at a designated frequency is shown in FIG. 2 and FIG. 3. Note however that a signal crystal may be utilized to produce the local oscillator signal for multiple frequencies and channels as shown in FIG. 5. Also note that although the present invention is depicted with only a single RF stage, multiple stages can be used, as is common for instance in super-heterodyne receivers. Thus, IF stages and filters and amplifiers are not shown or discussed.

Figure 9:
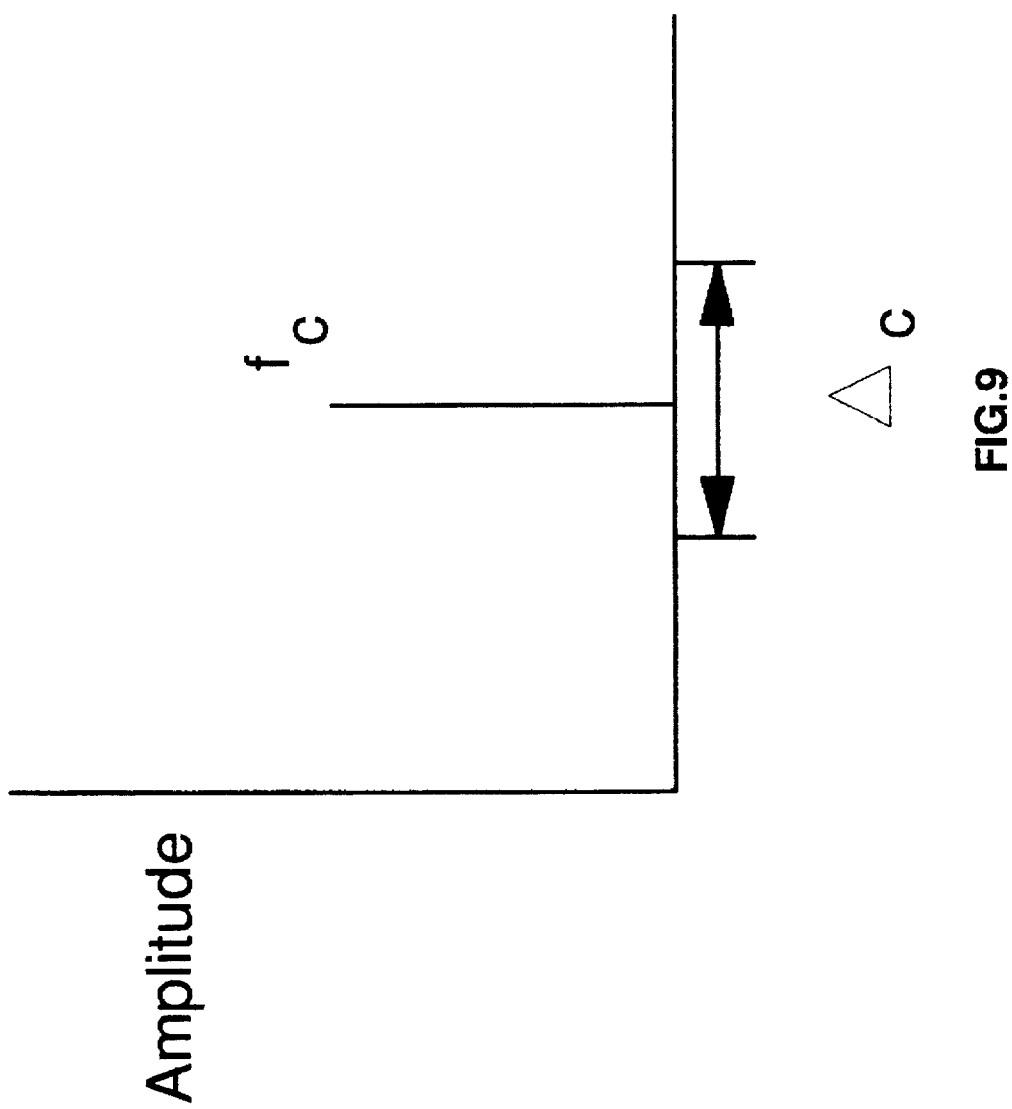
FIG. 9 depicts frequency error of a local oscillator crystal.

Frequency modulation (FM) changes the carrier frequency, or an intermediate frequency if channels are multiplexed, in proportion to the average value of a baseband signal. With FM the carrier frequency is modulated with the baseband signal. Most wireless modems make use of crystal controlled oscillator to generate a local oscillator frequency used to transmit and receive data signals to an from the air interface via an antenna. Due to variations in the crystal components there is usually frequency deviation associated with particular crystal oscillator components. As is shown in FIG. 9 a given crystal component has a frequency deviation shown as $\Delta_c$. Crystal components may be used to generate signals at numerous frequencies. Thus, one crystal can be used to support multiple local oscillator signals at various frequencies. In order to minimize the frequency deviation circuits are built with tunable components so that the circuits can be manually tuned to minimize the frequency deviation. This is done with mass produced FM radio components where the frequency deviation is different for each crystal in each device. The cost of the crystal components is directly dependant on the amount of deviation (i.e., the magnitude of $\Delta_c$). The smaller the $\Delta_c$ the higher cost. In addition to the cost of the crystal components and the labor intensive tweaking process must be added the cost of the tunable components.

Carrier Frequency Compensation for Received Signals

The present invention provides compensation for any difference between the frequency used to modulate and the frequency used to demodulate an FM signal. Thus, compensation for the difference between the carrier frequency of a received FM signal and the local oscillator frequency of the wireless modem is provided. FIG. 2 illustrates the signal path for the reception of FM signals. An FM signal is received from an antenna 109 and the received FM signal is provided to receiver 201. The receiver 201 takes the FM signal at the carrier frequency and outputs a baseband signal. This baseband signal is then processed by the DSP 105 to produce a data stream that the microprocessor 103 provides to the host device. The receiver 201 takes the FM signal at the carder frequency and outputs a baseband signal. This is illustrated in FIG. 2 using a mixer and a local oscillator with any amplifiers and filters omitted for clarity. Note that other techniques may be utilized to produce a baseband signal form the received FM modulated signal. Thus, multiple mixer stages may be used with intermediate frequency (IF) processing that can produce one or more baseband signals. The IF stage and amplifiers and filters are omitted for clarity.

Figure 10:
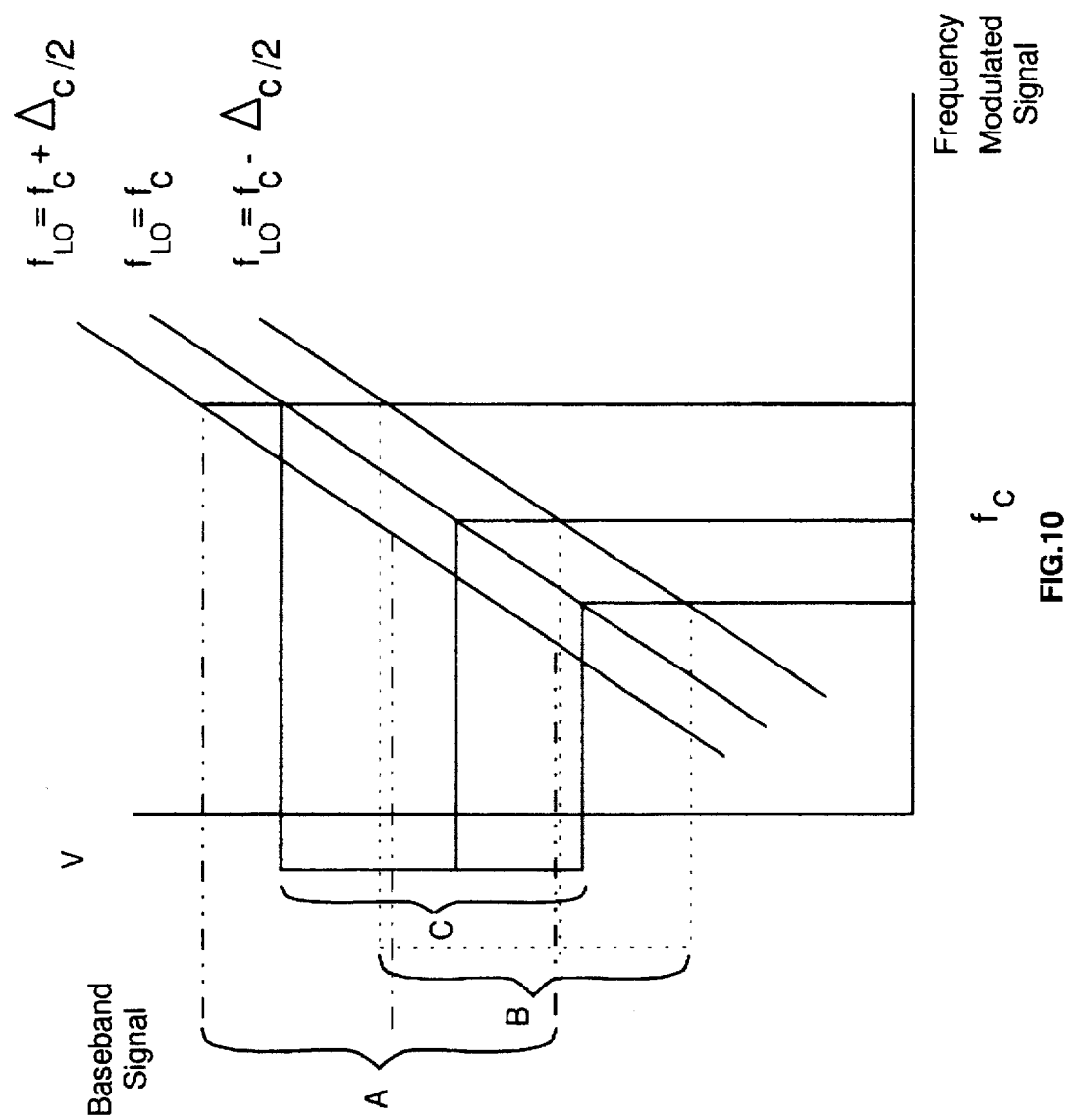
FIG. 10 depicts the relationship between baseband signal shift with carrier frequency.

It should be noted that when receiving an FM signal at a carrier frequency the difference between the FM carrier frequency and the local oscillator frequency produces a voltage that is proportional to the difference between the two frequencies. Demodulating the FM signal recovers the baseband signal from the changing carrier frequency of the FM signal. This is FM modulation. However, if the receiving local oscillator frequency (i.e., the frequency used to demodulate) is not the same frequency as that used by the transmitting local oscillator (i.e., the frequency used to modulate) an unintended difference or shift in the baseband signal occurs which is proportional to the frequency difference between the transmitter's local oscillator and the receiver's local oscillator. This is illustrated in FIG. 10. Assuming an FM signal at carrier frequency $f_c$ (i.e., generated by a transmitter's local oscillator at $f_c$) then depending on the receiver's local oscillator frequency the baseband signal generated by the FM receiver may be shifted (i.e., have an unintended DC bias). As shown in FIG. 10, if $f_{LO}=f_{C-\Delta C/2}$ then baseband signal C is generated. If $f_{LO}=f_{C+\Delta C/2}$ then the baseband signal is shifted as shown by A. If $f_{LO}=f_{C-\Delta C/2}$ then the baseband signal is shifted as shown by B. The frequency differences between the transmitter's local oscillator signal and the receiver's local oscillator signal produces a DC bias offset in the baseband signal (i.e., shifts the baseband signal).

Figure 4:
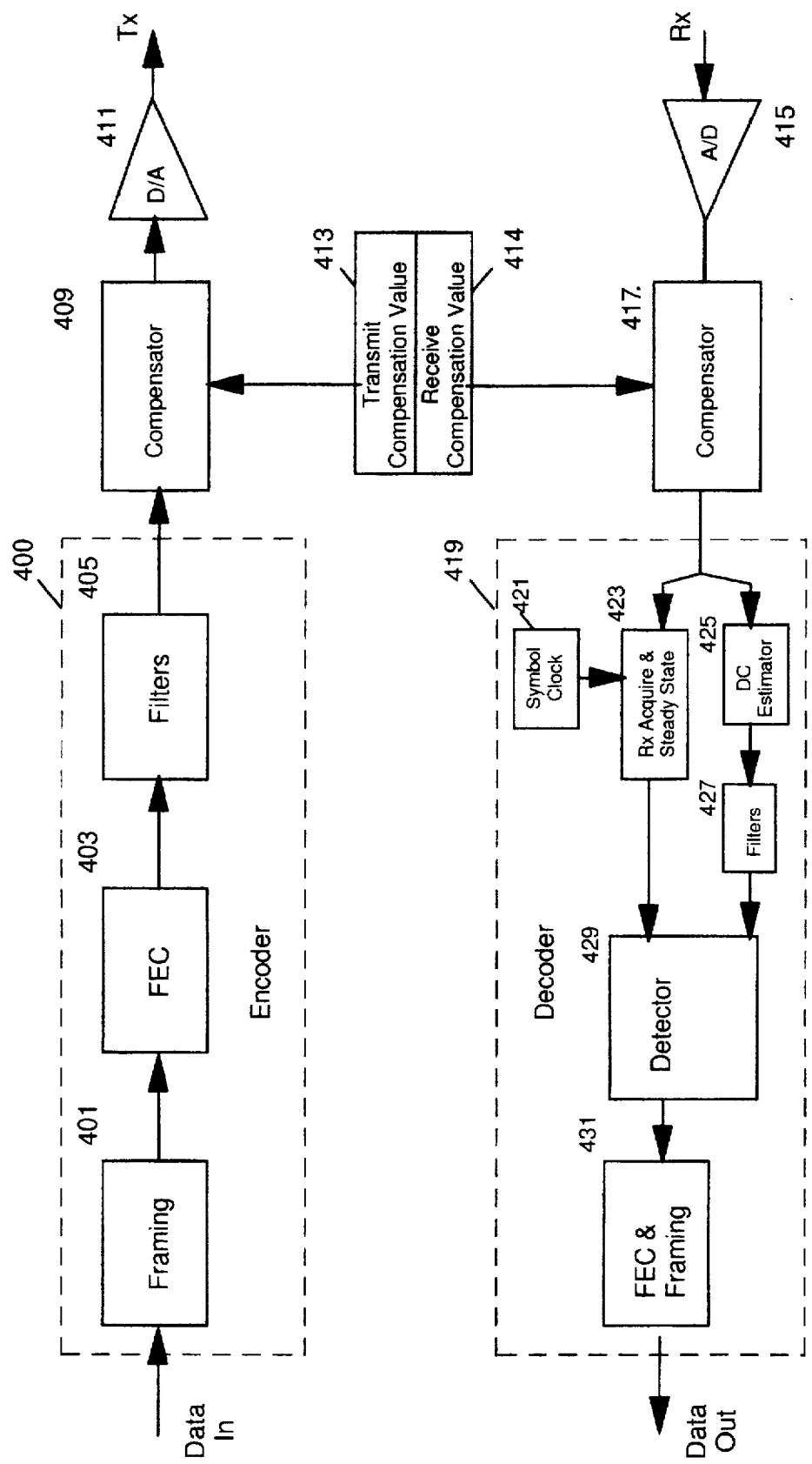
FIG. 4 depicts a more detailed look at the digital signal processing in a generic DSP.

The present invention compensates for such shifts. In the preferred embodiment this is accomplished in the DSP by using a receive compensation value. The DSP provides the adjustment for frequency error between the carrier frequency and the receivers's local oscillator frequency. The receive compensation value may be stored in the DSP or memory associated with the DSP or in NVM memory accessible by the DSP. Determination of the receive compensation value is discussed below. Note that FIG. 4 depicts DSP functions for transmitting and receiving FM signals with carrier frequency compensation. As shown in FIG. 4 the baseband signal from the receiver is converted to one or more digital samples by an A/D converter 415. The digital samples, which may be any bit length but are typically 8 or 16 bit, are then adjusted by a receive compensation value. The receive compensation value may added to or subtract from the value of each sample depending on the characteristics of the crystal used in the wireless modem. Note that any form of binary arithmetic may used to perform the adjustment. This adjustment can be thought of as shifting the baseband signal to the desired range (i.e. C of FIG. 10) regardless of any frequency difference between the local oscillator frequency used to demodulated the received FM signal and the local oscillator used to modulated the FM signal. The compensated digital samples are then decoded using standard decode functions as shown in the decoder 419 of FIG. 4. The Symbol Clock 421 and Rx Acquire & Steady State 423 work together to synchronize the device's symbol clock with the base station's (transmitter's) symbol clock. The DC Estimator 425 tracks the received signal and provides the average dc bias level over time. The detector 429 outputs the digital data which is then processed to remove any transmission errors and the forward error correction encoding and framing information that was added for wireless transmission. The data is then provide to the host device by the microprocessor.

A method of receiving and processing an FM signal is shown in FIG. 6. An FM signal having a carder frequency is demodulated to produce a baseband signal using a local oscillator signal in step 601. In step 603, the baseband signal is digitized or converted into one or more digital samples. In step 605, each digital sample is adjusted by a receive compensation value. And in step 607 the compensated digital sample stream is decoded to output a digital data stream.

Carrier Frequency Compensation for Transmitted Signals

Carrier frequency compensation of received FM signals has been discussed above. The carrier frequency compensation can also be provided for transmitted FM signals. Normally the dc bias level of the baseband signal, which is fed to the transmitter, is fixed at a design point or desired level. However the DC bias level can be adjusted based upon the frequency difference between the local oscillator and the desired carrier frequency of the transmitted FM signal. FIG. 3 illustrates the signal path for the transmission of FM signals through a FM radio modem of the present invention. Data to be transmitted is provided to the wireless modem from a host device to microprocessor or micro-controller 103. The microprocessor 103 provides this data to the DSP 301. The microprocessor may provide message formatting and framing functions. The DSP 301 performs encoding and the carrier frequency compensation function to produce an analog baseband signal. The transmitter 303 modulates or mixes the analog baseband signal with a local oscillator signal at a local oscillator frequency to produce an FM signal at a carrier frequency which is radiated via antenna 109.

The DSP 301 provides the adjustment for frequency error between the desired transmit carrier frequency and the local oscillator frequency. The transmit compensation value may be stored in the DSP or memory associated with the DSP or in NVM memory accessible by the DSP or microcontroller. Determination of the transmit compensation value is discussed below. As noted above when transmitting an FM signal at a carrier frequency any difference between the actual FM carrier frequency transmitted and the desired FM frequency of a channel can produce a voltage that is proportional to the difference between the two frequencies in the receiver system. Thus, if the receiver system is expecting a carrier frequency at $f_c$ but the transmitter is transmitting at $f_{c+\Delta}$ or $f_{c-\Delta}$ (i.e., using a local oscillator at these frequencies) errors or loss of error margin is caused in the receiver. This may be true even if the receiver provides carrier frequency error compensation, because receive compensation takes time to react, during which data may be lost.

However, if the transmitter's local oscillator frequency is not the same frequency as the desired carrier frequency then the DC bias value of the analog baseband signal can be adjusted to provide transmission at the desired frequency. By shifting the baseband signal in proportion to the frequency difference between the transmitter's local oscillator frequency and the desired carrier frequency, an FM signal is generated at the desired carrier frequency. This is illustrated in FIG. 10. Thus, if the transmitter uses a local oscillator frequency equal to the desired transmitter frequency then $f_{LO}=f_C$ and the baseband signal C is used without any compensation or shifting. If the transmitter uses a local oscillator frequency that is greater than the desired transmitted carrier frequency then $f_{LO}=f_{C+\Delta C/2}$. In this case the baseband signal is shifted down as shown by A, thus the DC bias of the baseband signal is decreased and the FM signal produced has the expected carrier frequency. If the transmitter uses a local oscillator signal that is less than the desired transmitted carrier frequency (i.e., $f_{LO}=f_{C-\Delta C/2}$), the baseband signal is shifted up as shown by B, thus the DC bias of the baseband signal is increased and the FM signal produced has the expected carrier frequency. Shifting the baseband signal, by adding or subtracting a DC bias signal, produces a frequency shift in the transmitted carrier frequency.

In the preferred embodiment carrier frequency compensation is accomplished in the DSP by using a transmit compensation value. The transmit compensation value along with one technique for determining the transmit compensation value is discussed below. As shown in FIG. 4 the data for transmission is provided from the microprocessor to the encoder 400. The encoder as shown in FIG. 4 includes framing 401 which causes a header and cyclical redundancy codes (CRC) to be added to the data. Fixed patterns such as symbol sync and frame sync may be added to help with decoding at the receiver. Channel status data may also be embedded in the data. Forward error correction 403 (such as Reed Solomon) may be utilized or other error detection and/or correction information may be added to the data/symbol stream. Trellis or convolution coding or other coding schemes may be utilized depending on the desired communication protocol. A digital filter 405 is applied to the data/symbol stream to produced desired waveform shaping. The digital samples, which may be any bit length but are typically 8 or 16 bit, are then adjusted by a transmit compensation value in the compensator 409. The transmit compensation value may added to or subtracted from the value of each sample depending on the characteristics of the crystal used in the wireless modem. Note that any form of binary arithmetic may used to perform the adjustment. This adjustment can be thought of as shifting the baseband signal to the desired range based on the frequency difference between the local oscillator and the desired transmitter carrier frequency. The digital samples are provided to a D/A converter 411. The compensated digital samples are then converted to an analog baseband signal having the appropriate DC bias level to generate the desired transmit carder frequency. The baseband signal is then modulated by the transmitter using the local oscillator signal to produce the FM signal at the desired carrier frequency which is radiated by the antenna.

Figure 7:
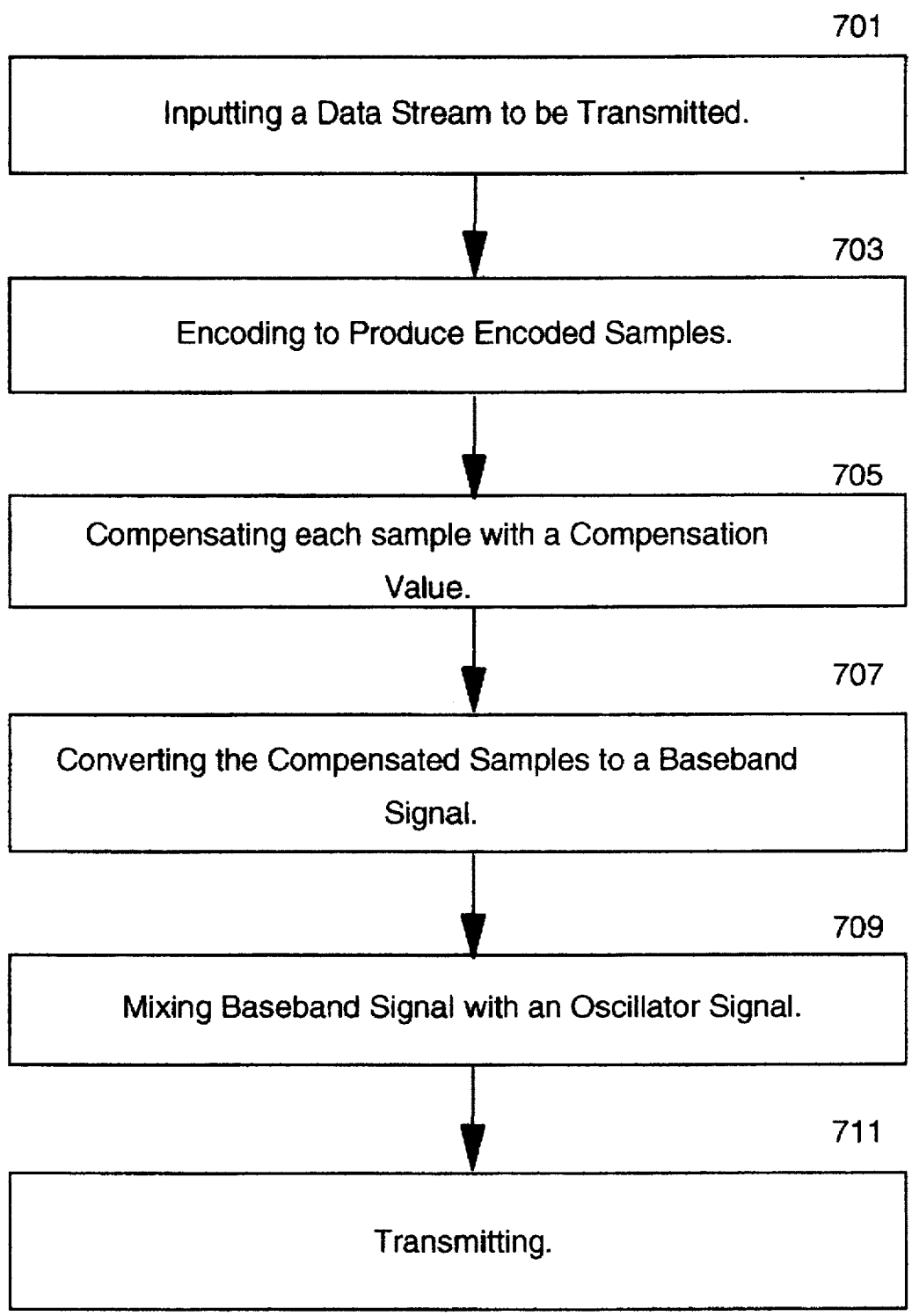
FIG. 7 depicts a method of transmitting FM signals in accordance with the present invention.

A method of transmitting an FM signal is shown in FIG. 7. Data to be transmitted is inputted in step 701. The data is encoded in step 703 to produce signal samples. Each sample is compensated for in step 705 by a transmit compensation value. In step 707 the samples are converted to an analog baseband signal. The baseband signal is then used to modulate a local oscillator signal in step 709 and the FM signal is transmitted in step 711.

TRANSCEIVER OPERATION

The present invention may be used to compensate for carrier frequency differences when receiving or transmitting FM signals as described above. It should be noted that the present invention may be utilized in a wireless modem that provides carder frequency compensation while transmitting and receiving FM signals. A DSP for performing both is depicted in FIG. 4. An antenna may be shared using a duplexer or the transmitter and receiver may utilize separate antennas. Note that in the preferred embodiment carder frequency compensation is provided for both transmitted and received signals. The carrier frequency compensation values (i.e., the receive compensation value and the transmit compensation value) are distinct in the preferred embodiment.

DETERMINING THE COMPENSATION VALUE

The use of compensation values for receiving and transmitting FM communications signals have been described above. One technique for determining these values and storing the values in the wireless modem is described herein.

Figure 8:
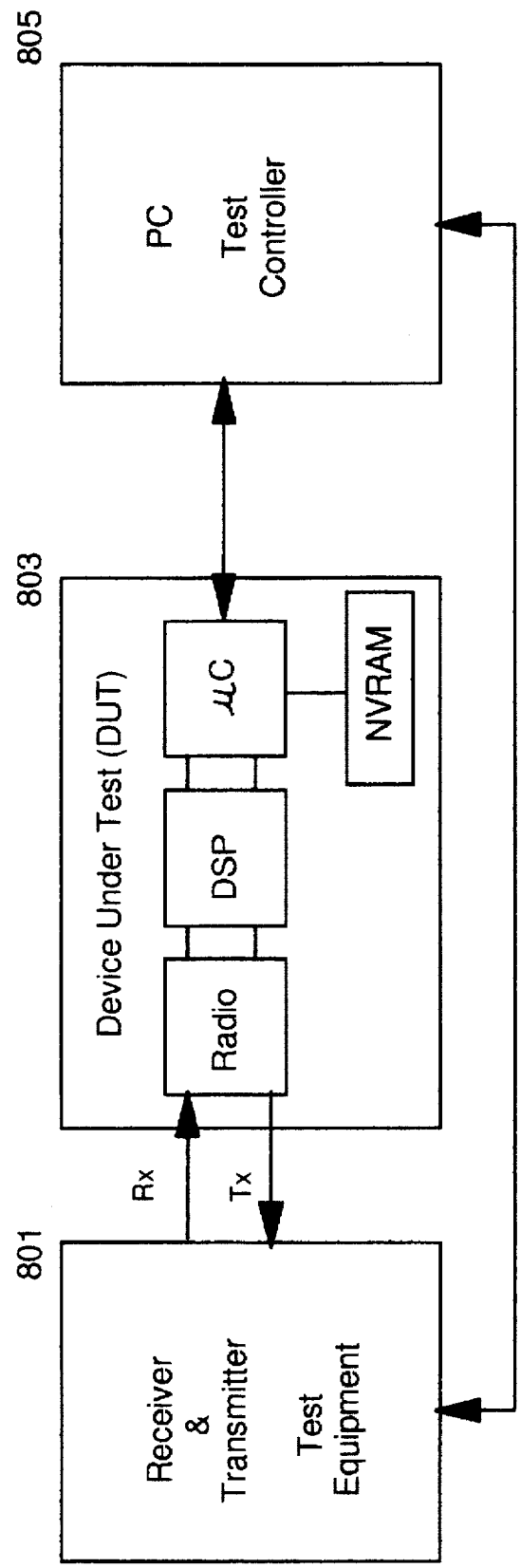
FIG. 8 depicts a configuration for determining and storing compensation values for a FM radio.

FIG. 8 depicts a test setup for determining the compensation values and saving the compensation values in the radio modem. The testing environment consists of a receiver/transmitter 801 and a test controller 805 which in the preferred embodiment is a properly equipped PC. The test controller 805 can write and read information from the memory of wireless modem and can send and receive data as a host device. As shown the test controller 805 can also be used to control the receiver transmitter 801. The receiver/transmitter 801 is used to generate FM signals for the device under test (DUT) 803, and receive FM radio signals from the DUT 803.

In order to determine the transmit compensation value to use when the DUT is transmitting FM signals the following procedure is used:

1) The test controller instructs the DUT to transmit a test signal;

2) The test receiver measures the DUT carrier frequency.
3) The test controller varies the transmit compensation value in the DSP of the DUT until the test receiver detects (or indicates to the test controller or determines) that the transmitter frequency is correct.
4) The test controller then saves the transmit compensation value in non-volatile memory of the DUT.

In order to determine the receive compensation value to use when the DUT is receiving FM signals the following procedure is used:

1) The test transmitter generates an FM signal at a test carrier frequency;
2) The test controller reads the correction value from the DC estimator in the DUT's DSP.
3) The test controller varies the receive compensation value in the DSP of the DUT until the correction value read is null.
4) The test controller then saves the receive compensation value in non-volatile memory of the DUT.

As can seen the above calibration and compensation determining procedures can be advantageously applied to radio modems as the modems are manufactured. Having determined the frequency error the compensation value can be determined and stored for access by the DSP. The compensation value (i.e., the DC bias level) can be determined for each unit manufactured. The compensation value is then used to compensate for the error or offset in each radio's carrier frequency. Thus, the present invention provides a radio modem with less carrier frequency variance. Additionally, since frequency error compensation can be achieved in this fashion with oscillator components that operate over a larger frequency range, lower cost oscillator components may be utilized. This technique permits more accurate products to be manufactured in large quantities, while specifying less accurate and less expensive crystal oscillator components. Furthermore, it eliminates carder frequency variation at the source of the carrier frequency (i.e., at the transmitter) or at the destination (i.e., at the receiver) or both (at the transmitter and the receiver). By transmitting on the correct frequency, there is less dependency on the automatic frequency correction mechanism at the receiver, and the data at the beginning of a transmitted frame is received with fewer errors. Likewise by compensating the received signal for any carder frequency error there is less dependency on the automatic frequency correction mechanism at the receiver, and the data at the beginning of a transmitted frame is received with fewer errors.

While the invention has been described in detail herein in accord with certain preferred embodiments thereof, modifications and changes therein may be effected by those skilled in the art. Accordingly, it is intended by the appended claims to cover all such modifications and changes as fall within the true spirit and scope of the invention.

What is claimed:

1. A radio data modem comprising:
   a receiver for demodulating an FM signal received from an antenna, said receiver producing an analog baseband signal, using a local oscillator generating a local oscillator frequency to provide the analog baseband signal, and
   a digital signal processor for converting the analog baseband signal into a stream of digital samples, compensating each of the digital samples by a receive compensation value, the receive compensation value related to the difference between a desired carder frequency and the local oscillator frequency, said DSP decoding the digital sample stream to produce a digital data stream.

2. The radio modem of claim 1 wherein the FM signal is received from an assigned channel with an associated carrier frequency.

3. The radio modem of claim 1 wherein the FM signal is obtained from an antenna.

4. The radio modem of claim 1 wherein the local oscillator frequency is provided by a programmable frequency synthesizer that uses a crystal to produce a plurality of frequencies.

5. The radio modem of claim 1 wherein decoding the stream of digital samples includes symbol clock acquisition, filtering, detecting, removing forward error correction and removing framing information.

6. The radio modem of claim 1 further comprising a microprocessor coupled to the digital signal processor, said microprocessor obtaining the digital data stream from the digital signal processor.

7. The radio modem of claim 6 wherein the microprocessor provides an interface from the radio modem to an external device.

8. The radio modem of claim 6 wherein the microprocessor provides an PCMCIA interface.

9. The radio modem of claim 8 further comprising:
   the digital signal processor inputs a transmit digital input stream, encodes the transmit digital input stream to produce a stream of transmit digital samples, converts the stream of digital samples to a transmit analog baseband signal; and
   a transmitter for modulating a transmit local oscillator frequency with the transmit analog baseband signal to provide a transmit FM signal which is radiated by an antenna.

10. The radio modem of claim 9 wherein the antenna is multiplexed between the receiver and the transmitter by a duplexor.

11. The radio modem of claim 1 wherein the local oscillator uses a crystal.

12. The radio modem of claim 1 further comprising:
   the digital signal processor inputs a transmit digital input stream, encodes the transmit digital input stream to produce a stream of transmit digital samples, converts the stream of digital samples to a transmit analog baseband signal; and
   a transmitter for modulating a transmit local oscillator frequency with the transmit analog baseband signal to provide a transmit FM signal which is radiated by an antenna.

13. The radio modem of claim 12 wherein the antenna is multiplexed between the receiver and the transmitter by a duplexor.

14. A method of receiving a RF signal comprising the steps of:
   demodulating a received FM signal with a signal generated by a local oscillator at a local oscillator frequency to produce a baseband signal;
   digitizing the baseband signal into a plurality of digital samples;
   compensating the digitized samples with a receive compensation value, the receive compensation value related to the difference between a desired carrier frequency and the local oscillator frequency;
   decoding the compensated digitized samples to provide a digital data stream; and
   outputting the digital data stream.

15. A method of receiving an FM signal comprising the steps of:

receiving a FM signal;

generating a local oscillator signal at a local oscillator frequency;

mixing the received FM signal with the local oscillator signal to produce a baseband signal;

converting the baseband signal to one or more digital data samples;

compensating each digital data sample by a receive compensation value, the receive compensation value related to the difference between a desired carrier frequency and the local oscillator frequency; and, decoding said digital data samples to produce a data stream.

16. An article of manufacture comprising a DSP useable medium having a DSP readable program embodied in said medium, wherein the DSP readable program when executed on a DSP causes the DSP to:

convert a baseband signal to one or more digital data samples;

compensate each digital data sample by a receive compensation value, the receive compensation value related to the difference between a desired carrier frequency and a local oscillator frequency used to produce the baseband signal; and, decode said digital data samples to produce a data stream.

* * * * *